US012808912B2

(12) United States Patent
Rizzo et al.

(10) Patent No.: US 12,808,912 B2
(45) Date of Patent: Nov. 24, 2026

(54) METHOD AND SYSTEM FOR EVALUATING DIELECTRIC LOSSES IN HVDC ELECTRICAL OBJECTS

(71) Applicant: Prysmian S.p.A., Milan (IT)

(72) Inventors: Giuseppe Rizzo, Palermo (IT); Fabrizio Buccheri, Palermo (IT)

(73) Assignee: PRYSMIAN S.P.A., Milan (IT)

( * ) Notice: Subject to any disclaimer, the term of this patent is extended or adjusted under 35 U.S.C. 154(b) by 147 days.

(21) Appl. No.: 18/984,606

(22) Filed: Dec. 17, 2024

(65) Prior Publication Data

US 2025/0208181 A1 Jun. 26, 2025

(30) Foreign Application Priority Data

Dec. 20, 2023 (IT) ........................ 102023000027435

(51) Int. Cl.
*G01R 27/26* (2006.01)

(52) U.S. Cl.
CPC ................................ *G01R 27/2694* (2013.01)

(58) Field of Classification Search
CPC ................ G01K 17/00; G01R 27/2694; G01R 31/1272; G01R 31/1254; G01N 33/54366;
(Continued)

(56) References Cited

U.S. PATENT DOCUMENTS 3,133,592 A * 5/1964 Tomberlin .......... E21B 43/2401
219/679
7,831,133 B2 * 11/2010 Vinegar .................. E21B 43/17
392/301

(Continued)

FOREIGN PATENT DOCUMENTS

| | | |
|---|---|---|
| CN | 102539964 A | 7/2012 |
| CN | 104678267 A | 6/2015 |
| CN | 113884826 A | 1/2022 |

OTHER PUBLICATIONS

A. Hascoat et al., "Study and analysis of conduction mechanisms and space charge accumulation phenomena under high applied DC electric field in XLPE for HVDC cable application," 2014 IEEE Conference on Electrical Insulation and Dielectric Phenomena (CEIDP), 2014, pp. 530-533.

(Continued)

*Primary Examiner* — Vinh P Nguyen
(74) *Attorney, Agent, or Firm* — Seed IP Law Group LLP

(57) ABSTRACT

Method for evaluating dielectric losses, comprising: providing a HVDC electrical object (1) comprising: an electrical conductor (4) having a centre (C), an insulating layer (5); a metallic screen (6) and an outer sheath (7). The method comprising: applying an HVDC voltage making an electrical current flowing through the electrical conductor (4); computing a first heat flux (WC) exiting said electrical conductor (4) as function of an intensity of said electrical current; measuring an internal temperature (tin) and an external temperature (tou) by temperature sensors (10, 11) arranged at different radial distances from said centre; determining a thermal resistance (TR) of a portion of said components comprised between the first (10) and second (11) temperature sensors, computing a second heat flux (Fi) exiting said portion as a function of the thermal resistance (TR); computing dielectric losses (WD) of the insulating layer (5) as a difference between the second heat flux (Fi) and the first heat flux (WC).

14 Claims, 5 Drawing Sheets

100

(58) Field of Classification Search
CPC ............... G01N 25/482; G06F 2119/08; G06F 2119/02; G06F 30/27
See application file for complete search history.

(56) References Cited

U.S. PATENT DOCUMENTS

| | | | | |
|---|---|---|---|---|
| 12,313,477 | B2 * | 5/2025 | Roghanizad | A61B 5/015 |
| 2013/0087551 | A1 * | 4/2013 | de St. Remey | H05B 3/56<br>219/552 |

OTHER PUBLICATIONS

B. Diban et al., "Preliminary Estimation of The Effect of Insulation Losses on HVDC Cable Reliability," 2020 IEEE Conference on Electrical Insulation and Dielectric Phenomena (CEIDP), 2020, pp. 466-469.
H. Brakelmann et al., "Current Rating Considerations in Designing HVDC Cable Installations," in IEEE Transactions on Power Delivery, vol. 33, No. 5, pp. 2315-2323, Oct. 2018.
Melios Christos et al., "Determining the Dynamic Insulation Resistance of DC Cables Used in Photovoltaic Systems Under Operational Conditions," 2021 IEEE International Conference of Environment and Electrical Engineering and 2021 IEEE Industrial and Commercial Power Systems Europe (EEEIC/I&CPS Europe), Sep. 7, 2021, pp. 1-6.
R. Mardiana, "Parameters affecting the ampacity of HVDC submarine power cables," 2011 2nd International Conference on Electric Power and Energy Conversion Systems (EPECS), 2011, pp. 1-6.
S. L. Roy et al., "Modelling space charge in a cable geometry," in IEEE Transactions on Dielectrics and Electrical Insulation, vol. 23, No. 4, pp. 2361-2367, Aug. 2016.
U. Farooq et al., "Temperature Field Simulation and Ampacity Optimization of 500kV HVDC Submarine Transmission Cable," 2021 International Conference on Advanced Electrical Equipment and Reliable Operation (AEERO), 2021, pp. 1-6.

* cited by examiner

METHOD AND SYSTEM FOR EVALUATING DIELECTRIC LOSSES IN HVDC ELECTRICAL OBJECTS

BACKGROUND

Technical Field

The present disclosure relates to techniques for evaluating dielectric losses in insulations of High Voltage Direct Current (HVDC) electrical objects, such as cables, cable joints or their combinations.

Description of the Related Art

Online monitoring of HVDC cables and accessories can be based on Partial Discharges (PD) measurements, Distributed Temperature Sensing (DTS) and Distributed Acoustic Sensing (DAS) systems. Additional information on power cable systems can be estimated using algorithms such as Real Time Thermal Rating (RTTR) engines.

PD measurement aims to detect the presence of defects inside the insulation or at the interfaces between the insulation and the semiconductive layers. DTS and DAS systems measure temperature and vibration respectively. Data points are obtained over the whole length of a cable by means of a fiber optic used as distributed sensor.

The goal of a DTS system is the detection of hotspot or temperature anomalies due to defects in the power cables or due to the environment surrounding it. The measured temperature can be used as input to calculation systems like the RTTR engines to compute the conductor temperature distribution and real time static and emergency rating for the power cable system.

Other than the temperature measured by the DTS, the common RTTR systems use as input an estimation of the losses inside the cable layers, a thermal model of the cable and, in some cases, of the external environment, and the load current.

In a HVDC cable, the losses are typically located into the conductor, into the dielectric layer and into the screen. More practically, the losses into the screen are approximately zero due to the absence of a magnetic flux varying over time. The dielectric losses inside the insulation of HVDC cables are typically lower than those in HVAC cables, where they are due to conduction phenomena and dipole polarization hysteresis. In the HVDC case, the losses due to conduction phenomena are largely preponderant over the ones due to dipole polarization.

In HVDC cables, dielectric losses are mainly due to the leakage current through the insulation. The standards for the calculation of the thermal rating of cables do not provide indications on the calculation of the dielectric losses in HVDC cables. However, the effect of the dielectric losses under HVDC stress is commonly evaluated during the test phase (i.e. not when the cable is in operation) in terms of over temperature (temperature difference) between two identical cables under an identical load, one under voltage stress whilst the other is grounded. In dielectric materials, due to the interdependence between electrical conductivity and dielectric losses, the leakage current can be roughly calculated through complex conductivity or bipolar charge transport models. It is observed that such models cannot consider the ageing of the insulation as well as the presence of inhomogeneities and defects. The common practice is to neglect both dielectric and screen losses in the Real Rime Thermal Rating for HVDC cables and accessories.

BRIEF SUMMARY

The Applicant notices that no specific standard is known for the design calculation or the real-time (i.e., during the operation of the cable) calculation for monitoring of the dielectric losses within the insulation of HVDC cables and accessories. The Applicant has noted that according to the prior art, no techniques are available that allow evaluating dielectric losses in HVDC electrical objects (provided with a conductor and an insulation layer) in real-time and without requiring complex mathematical methods.

The Applicant has found that a real-time and non-complex evaluation of dielectric losses in insulation layer of HVDC electrical objects can be performed through the computing of a heat flux exiting the conductor of the electrical object and a heat flux exiting the insulation layer of the same electrical object, where the latter flux is obtainable by temperature measurements at external and internal points of the electrical object.

According to a first aspect, the present disclosure relates to a method for evaluating dielectric losses, comprising:

- providing a HVDC, High Voltage Direct Current, electrical object (comprising the following components: an electrical conductor where a centre of the electrical object lies, an insulating layer surrounding said electrical conductor; a metallic screen surrounding said insulating layer; an outer sheath surrounding the metallic screen;
- applying an HVDC voltage between the conductor and the metallic screen and setting the HVDC object in operating condition (so making an electrical current flowing through the electrical conductor);
- computing a first heat flux exiting said electrical conductor as function of an intensity of said electrical current;
- measuring an internal temperature by a first temperature sensor arranged internally to the HVDC electrical object at a first radial distance from the centre;
- measuring an external temperature by a second temperature sensor arranged at a second radial distance from the centre greater than the first radial distance;
- acquiring the internal and external temperatures and performing the following digital processing:
- determining a thermal resistance of a portion of said components comprised between the first and second temperature sensors,
- computing a second heat flux exiting said portion as a function of the thermal resistance and a difference between said internal and external temperatures;
- computing dielectric losses of the insulating layer as a difference between the second heat flux and the first heat flux.

In an embodiment, the HVDC electrical object is selected from the group: HVDC cable, HVDC cable joint, HVDC cable including a HVDC cable joint.

In an embodiment, the first temperature sensor is arranged in one of the following ways: between an external wall of the insulating layer and the metallic screen; embedded into the metallic screen.

In an embodiment, the second temperature sensor is arranged on an external face of the outer sheath.

In an embodiment, first temperature sensor and/or the second temperature sensor comprises one of the following devices: Distributed Optical Sensing System, thermocouple sensors.

In an embodiment, determining the thermal resistance comprises retrieving a thermal resistance value from one of more recorded values.

In an embodiment, determining the thermal resistance comprises:

computing a first thermal resistance of said metallic screen computing a second thermal resistance of said outer sheath;

computing a third thermal resistance of materials comprised between the outer sheath and the second temperature sensor, obtaining said thermal resistance by adding the first thermal resistance, the second thermal resistance and the third thermal resistance.

In an embodiment, the method further comprises: computing a third heat flux corresponding to losses into the metallic screen and computing the dielectric losses of the insulating layer by subtracting said third heat flux from said difference between the second heat flux and the first heat flux.

In an embodiment, computing the dielectric losses of the insulating layer is performed by considering time averages over a time interval of at least the following quantities: external temperature, internal temperature, first heat flux.

In an embodiment, computing the first heat flux comprises evaluating: an electrical resistance per unit length of said electrical conductor as a function of the temperature of the electrical conductor.

In an embodiment, computing the first heat flux further comprising: evaluating a temperature assumed by the electrical conductor by Real Time Thermal Rating.

In an embodiment, the method further comprises defining a threshold value comparing said threshold value with a comparison quantity depending on said dielectric losses; detecting an alarm condition when the comparison quantity is greater than said threshold value; wherein said comparison quantity is one of the following: said dielectric losses, a derivative over time of said dielectric losses.

According to a second aspect, the following disclosure relates to a dielectric losses evaluation system, comprising:

a HVDC, High Voltage Direct Current, electrical object comprising the following components: an electrical conductor for an electrical current; an insulating layer surrounding said electrical conductor; a metallic screen surrounding said insulating layer; an outer sheath surrounding the metallic screen; wherein a geometrical centre of the electrical conductor defines a centre of the electrical object;

a first temperature sensor arranged internally to the HVDC electrical object configured to measure an internal temperature and arranged at a first radial distance from the centre;

a second temperature sensor at a second radial distance from the centre, wherein the second radial distance is greater than the first radial distance and configured to measure an external temperature;

a processor configured to acquire the internal and external temperatures and perform the following digital processing:

computing a first heat flux exiting said electrical conductor as function of an intensity of said electrical current;

determining a thermal resistance of a portion of said components comprised between the first and second temperature sensors, computing a second heat flux exiting said portion as a function of the thermal resistance and a difference between said internal and external temperatures;

computing dielectric losses of the insulating layer as a difference between the second heat flux and the first heat flux.

In an embodiment, the first temperature sensor and the second temperature sensor (11) are Distributed Optical Sensing System, and the second temperature sensor (11) is arranged externally to the outer sheath (5).

BRIEF DESCRIPTION OF THE SEVERAL VIEWS OF THE DRAWINGS

Further characteristics and advantages will be more apparent from the following description of the various embodiments given as a way of an example with reference to the enclosed drawings in which.

DETAILED DESCRIPTION

Figure 1:
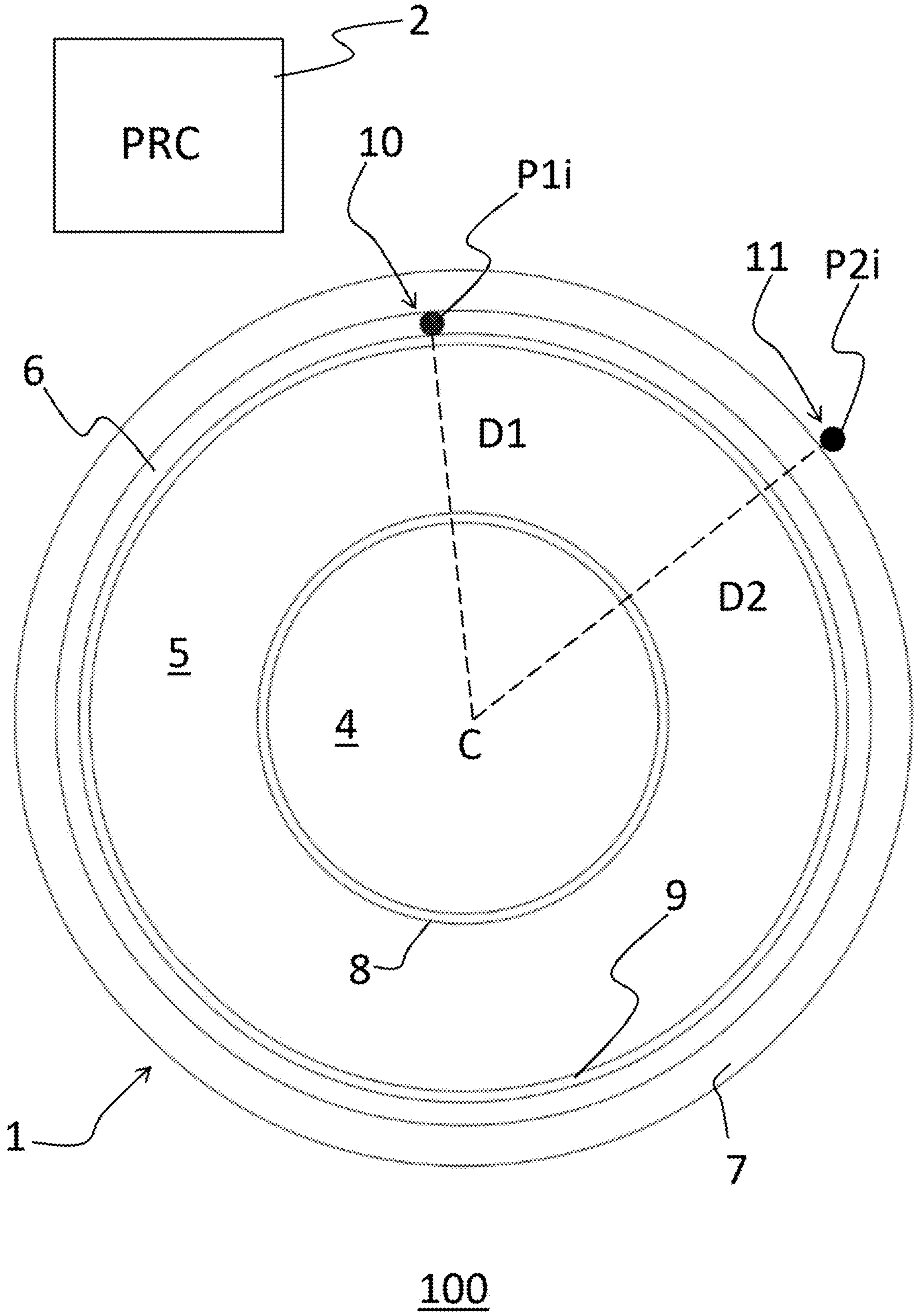
FIG. 1 schematically shows an example of a dielectric losses evaluation system including an example of a HVDC electrical cable 1, shown in a sectional view, and two temperature sensors.

FIG. 1 shows schematically an example of a dielectric losses evaluation system 100 comprising a High Voltage Direct Current (HVDC) electrical object 1, a processor 2 (PRC), an internal temperature sensor 10 and an external temperature sensor 11. For example, the electrical object 1 can be a HVDC cable, a HVDC cable joint or a HVDC cable including a HVDC joint. The above listed HVDC electrical objects can be submarine electrical objects or underground electrical objects. For the scope of this disclosure HVDC electrical objects are designed to be subject to HVDC voltage. Within this disclosure, as HVDC voltage is meant a direct voltage higher than 50 kV.

FIG. 1 refers to a particular embodiment in which the HVDC electrical object 1 is a cable, but the present description is also valid for other HVDC electrical objects.

The HVDC electrical object 1, represented in FIG. 1 as an example, comprises the following components: an electrical conductor 4; an insulating layer 5 surrounding said electrical conductor; a metallic screen 6 surrounding said insulating layer 5 and commonly set at ground potential in operating conditions; an outer sheath 7 surrounding the metallic screen 6. The HVDC electrical object 1 has a substantially elongated cylindrical shape.

The following description will refer to the case in which the HVDC electrical object 1 is a HVDC cable (as shown in FIG. 1), but it is also valid for other types of HVDC electrical objects, as the skilled in the art will recognize.

For example, the HVDC cable 1 may also comprise (as shown in the drawings) an inner semiconductive layer 8, placed between the electrical conductor 4 and the insulating layer 5, and an outer semiconductive layer 9 placed between the metallic screen 6 and the 5 outer sheath 7. The inner semiconductive layer 8 surrounds the electrical conductor 4 and the outer semiconductive layer 9 surrounds the insulation layer 5.

The material of the insulating layer 5 can be, for example, cross-linked or thermoplastic polymer or Mass Impregnated paper; the inner and outer semiconductive layers 8 and 9 can be, for example, of EPR, ethylene/propylene/diene terpolymers (EPDM) or a mixture thereof, charged with a suitable amount of a conductive filler, which can be typically carbon black. Alternatively, both the insulating layer and semi conductive layers can be made of thermoplastic compounds, such as polypropylene based compounds.

The HVDC cable 1 (hereinafter, "cable 1", for sake of brevity) further includes a first temperature sensor 10 arranged internally to the cable 1. Considering that the cable 1 (like the other electrical objects above indicted) has a substantial cylindrical shape, the first temperature sensor 10 is arranged at a first radial distance D1 with reference to a cable centre C. For example, the first temperature sensor 10 is arranged between an external wall of the insulating layer 5 and an internal wall of the outer sheath 7. It is noticed that the cable centre C may correspond with the geometrical centre of the electrical conductor 4.

In some configurations, the first temperature sensor 10 is embedded in the metallic screen 7 in a way analogous, as an example, to metallic wires forming the screen 7. According to an embodiment, the first temperature sensor 10 can be placed between the outer semiconductive layer 9 (when provided) and the internal wall of the outer sheath 7, as explicatively shown in FIG. 1.

The first temperature sensor 10 is configured to provide temperature values assumed, in an observation time, by a first measuring point P1 internal to the cable 1. In some implementations, the first temperature sensor 10 is configured to provide a plurality of temperature values assumed internally to the cable 1 by further measuring points distributed along a portion or the whole length of the cable 1.

The first temperature sensor 10 can comprise: Distributed Optical Sensing System (such as DTS) a plurality of thermocouple sensors or other sensors. For example, the first optical sensor 10 can include an optical fibre cable such as the one embedded in some HVDC cables, according to known techniques, to operate as temperature sensor: this optical fibre cable is normally housed in metal (steel) tube for protection purposes.

Moreover, the dielectric losses evaluation system 100 (hereinafter referred to as system 100) comprises a second temperature sensor 11. The second temperature sensor 11 is arranged at a second radial distance D2 from the centre C of the cable 1 greater than the first radial distance D1. According to an example, the second temperature sensor 11 is placed externally to the outer sheath 7 of the cable 1. The second temperature sensor 11 can be fixed to an external face of the outer sheath 7 or can be placed into proximity of the outer sheath 7. The second temperature sensor 11 can be analogous to the first optical sensor 10 and can be fixed to the outer sheath 7, as an example, by means of adhesive or elastic tapes. For example, when the second temperature sensor 11 includes an optical fiber or an optical cable, this sensor can be helicoidally wrapped around the outer sheath 7.

The second temperature sensor 11 is configured to provide temperature values assumed, in an observation time, by a second measuring point P2 which is for example, external to the cable 1. In some implementations, the second temperature sensor 11 is configured to provide a plurality of temperature values assumed externally to the cable 1 by further points distributed along a portion or the whole length of the cable 1. The second measuring point P2 defines the second radial distance D2 with reference to a cable centre C, which is greater than said first radial distance D1. In other words, the first measuring point P1 and the second measuring point P2 (e.g., laying at a same length along a longitudinal axis of the cable 1) are placed at different radial positions. It is further to be noted that the first measuring point P1 and the second measuring point P2 can be placed at different angular positions with respect to each other, as represented in FIG. 1.

It is noticed that the first and second temperature sensor 10 and 11, when realized by an optical fibre, may have, as an example, a resolution of about 1 m.

The processor 2 (such as an example, a microprocessor, an ASIC—Application Specific Integrated Circuit—or a computer) can be placed in the area of an end of the cable 1 or can be remote from it and is connected (with wires or in a wireless modality) to the first temperature sensor 10 and the second temperature sensor 11.

In accordance with an embodiment, the processor 2 is configured (by a suitable software) to perform both the acquisition functions (e.g. conditioning and A/D conversion of signals provided by the first and second temperature sensors 10 and 11) and data analysis with the aim of the dielectric loss evaluation. According to another example, the data acquisition functions are performed by an electronic circuit placed in the area an end of the cable 1 while the analysis with the dielectric loss evaluation is performed by another processor device. Said processor device may be remotely placed with respect to the cable 1.

The system 100 is configured to evaluate the dielectric losses of the cable 1. It is noticed that such dielectric losses are mainly due to the leakage current through the insulation layer 5.

The electric field distribution inside the dielectric layer of HVDC electrical objects 1 is related to the temperature distribution. This is because the entity of the accumulation, movement and injection of charge carriers within the insulation (such as the insulation layer 5) depend on temperature and electric field. From a macroscopic point of view, this can be considered as a dependence of the electrical conductivity of the dielectric (i.e. the insulation layer 5) on the temperature and electric field.

These phenomena lead to the establishment of non-uniform leakage current and therefore to the existence of space charge into the bulk of the dielectric layer. In HVDC electrical objects, due to the relatively long times during which the insulation is subjected to constant voltage, the charge carriers have time to accumulate until they affect the spatial electric field distribution. The leakage current through the insulation of HVDC electrical objects leads to the establishment of ohmic losses that can significantly affect the temperature distribution.

As the temperature increases, the electrical conductivity increases and the interdependence between leakage current and temperature distribution can lead to thermal runaway phenomena. For these reasons, the knowledge of the magnitude of dielectric losses within the insulation layer of HVDC electrical objects it's important to monitor the operating conditions of these assets.

As mentioned before, the dielectric losses depend on the characteristic of the material insulation layer 5, the applied voltage and the temperature distribution over the insulation thickness. Once exceeded a certain temperature range depending on the specific material, the dielectric losses are big enough to affect the temperature distribution over the insulation thickness. In this condition, the thermal runaway can lead rapidly to a severe insulation fault.

In the description of the embodiments herein, scientific analysis is provided, which useful to fully implement the method for evaluating dielectric losses.

It is again underlined that the description below refers to the cable 1 but its teachings are also valid for other HVDC electrical objects as above described.

Under thermal equilibrium, the radial heat flux going out from the cable 1 is equal to the sum of the heat generation contributions of each component of the cable itself.

The radial heat flux exiting a portion of the cable 1 can be obtained through two temperature measured values of the above defined first and second points P1 and P2, having two different radial positions in the cable section. The evaluation of the radial heat flux is also performed basing on thermal and geometrical characteristics of the materials between these two points.

For example, the heat losses in the cable 1 can be related to the conductor 4, to the dielectric material of the insulation layer 5 and to the metallic screen 6 (or other metallic layer outside the insulation).

Under HVDC voltage and current stress, the losses of conductor 4 can be calculated considering that they are related to the Joule losses. It is noticed that the losses into the metallic screen 6 are typically negligible in HVDC cables and joints because the time derivative of the magnetic flux going out from the conductor 4 is near to zero.

Therefore, the heat flux balance between the generated heat and the dissipated heat from a portion of cable 1 can be used to calculate the dielectric losses in the corresponding portion as follows:

$$WC + WD + WSC = \frac{tin - tou}{TR} \tag{1}$$

Where WC are the losses into the conductor 4, WD are the losses into the dielectric material of the insulation layer 5 and WSC are the losses into the metallic layers of the screen 6 respectively. The value tin is the temperature value measured by the first temperature sensor 10 at the first point P1. The value tou is the temperature value measured by the second temperature sensor 11 at the second point P2. The quantity TR is the thermal resistance of the group of components comprised between the two points P1 and P2.

As mentioned before, the heat flux WSC can be considered equal to zero. However, in some cases, due to the proximity of other HVAC operating cables, an electrical current can be induced into the metallic layers of the screen 6 of an HVDC cable, therefore, in these cases, this current should be measured at least at each termination. In the general cases, when no AC systems operate near the HVDC cable, the dielectric losses in the insulating layer 5 can be calculated as follows:

$$WD = \frac{tin - tou}{TR} - WC \tag{2}$$

Where, TR is the thermal resistance of the components comprised between points the two points P1 and P2.

Figure 2:
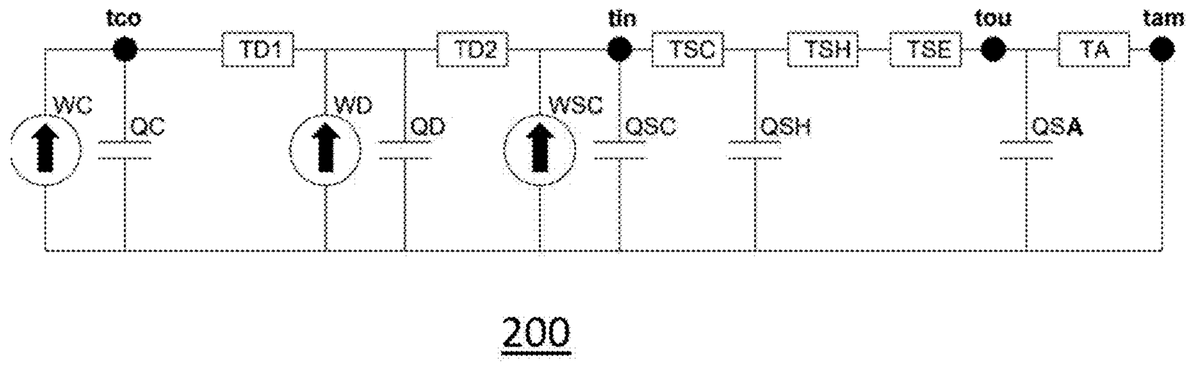
FIG. 2 represents a ladder equivalent electrical circuit for modelling thermal phenomena occurring in said electrical cable.

The evaluation of the quantities of the equations (1) and (2) can be made considering a schematization model that describes cable 1 by an equivalent electrical circuit 200, as represented in FIG. 2. The components indicated in FIG. 2 correspond to the following quantities (some of them already defined):

- WC is the heat power generated within the conductor 4;
- WD is dielectric loss in the insulation layer 5 (and the outer and inner layers 8 and 9, when provided);
- WSC is the heat power generated within the metallic screen 6;
- TD1 is the thermal resistance of the first part of the insulating layer 5 (between an outer radius of the conductor 4 and a "heat generation centre" of the insulation layer 5);
- TD2 is the thermal resistance of the second part of the insulation layer 5 (between the "heat generation centre" of the dielectric and the inner radius of the screen);
- TSC is the thermal resistance of the materials between the inner radius of the screen 6 and the inner radius of the outer sheath 7;
- TSH is the thermal resistance of the outer sheath 7;
- TSE is the thermal resistance between the outer sheath 7 and the second temperature sensor 11;
- TA is the thermal resistance between the second temperature sensor 11 and the undisturbed ambient temperature;
- QC is the thermal inertia of the conductor 4;
- QD is the sum of the thermal inertia of the layers between the outer radius of the conductor 4 and the inner radius of the screen 6;
- QSC is the thermal inertia of the materials between the inner radius of the screen 6 and the inner radius of the outer sheath 7;
- QSH is the thermal inertia of the outer sheath 7;
- QSA is the thermal inertia of the medium between the second temperature sensor 11 and the undisturbed ambient temperature;
- tco is the temperature of the conductor 4;
- tin is the temperature measured by the first temperature sensor 10;
- tou is the temperature measured by the second temperature sensor 11;
- tam is the undisturbed ambient temperature.

As can be observed from the FIG. 2, according to the employed model the heat power generation is modelled as "current generators", the thermal resistances as electrical resistors and the thermal inertia as capacitors. The temperatures can be considered as "voltages" that can be evaluated at the nodes of this equivalent circuit 200.

Under steady state or considering long term average, the behaviour of the inertial elements modelled as capacitors is like an open circuit. Therefore, the "equivalent current" entering the node where tin is equal to the sum of the three contributions: WC, WD and WSC.

The terms TSC, TSH and TSE can be collapsed into an equivalent resistance TR equal to the sum of these three elements. Finally, the elements at the right-hand side of the node where tou is evaluated do not affect the behaviour of the model. For these reasons, the equivalent circuit of FIG. 2, can be simplified as the one shown in FIG. 3. By using this simplified scheme, the heat flux $F_i$ crossing the layers between the points (P1 e P2) where tin and tou are evaluated can be calculated as follows:

$$F_i = \frac{tin - tou}{TR} \tag{3}$$

Figure 3:
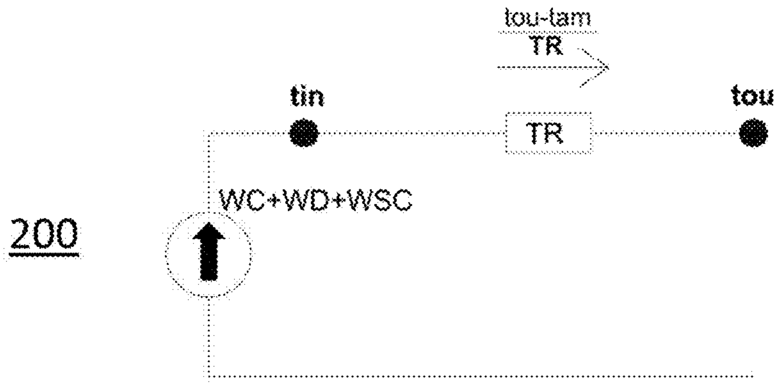
FIG. 3 represents a simplified ladder equivalent electrical circuit of said electrical cable.
Figure 4:
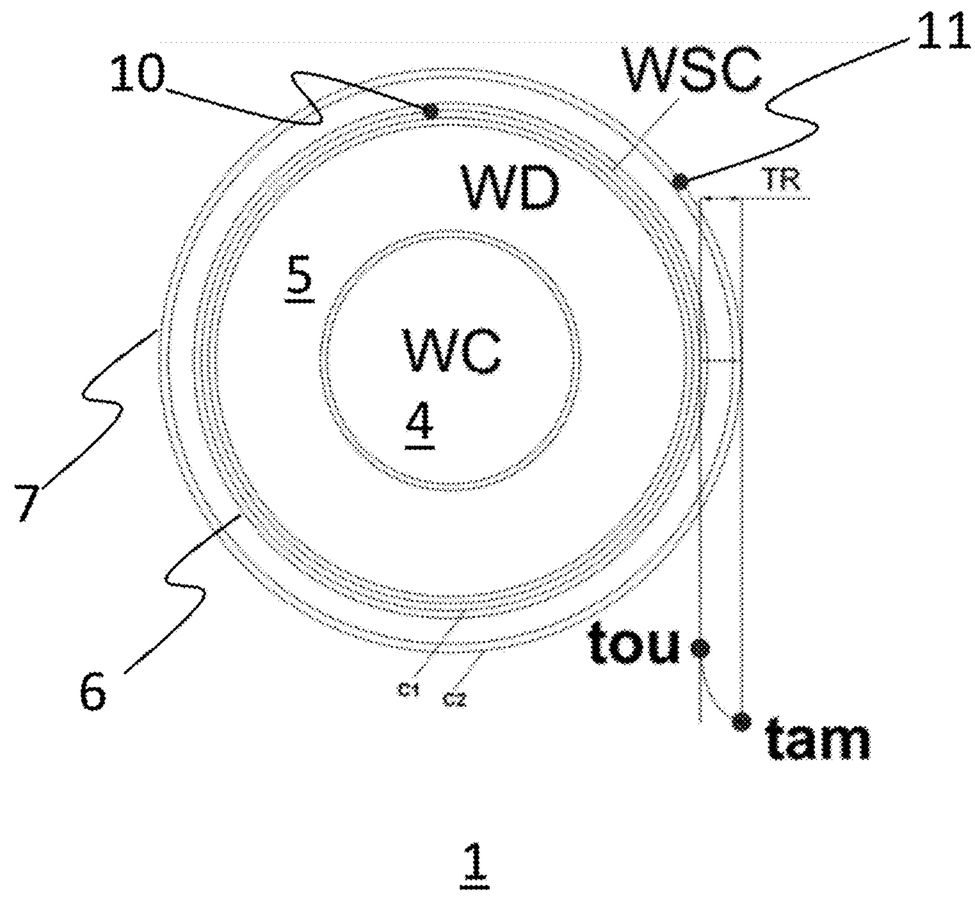
FIG. 4 represents a geometrical scheme of the heath flux between the two temperature sensors.
Figure 5:
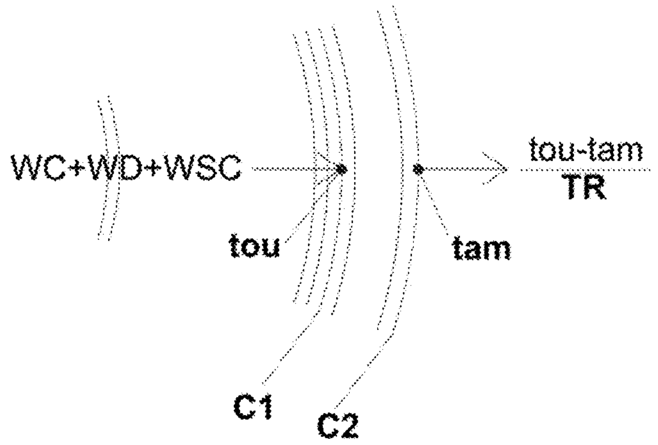
FIG. 5 represents details of the geometrical scheme of FIG. 4.

The circuit in FIG. 3 is associated to the geometrical scheme shown in FIG. 4 and FIG. 5 for the details. Assuming the heat flux does not vary angularly, the heat flux is calculated between two circumferences C1 and C2 centred in the centre of the cable 1 and passing from a centre of the first temperature sensor 10 and the centre of the second temperature sensor 11, respectively.

It is observed that, in transient conditions (such as variations of load or voltage as well as of conditions of heat transfer with the outside), the values WC, WD, WSC, tin and tou can be expressed as functions of time. Also, the thermal resistance TR can be expressed as a function of an average temperature tm between the values tin and tout, in turn variable over time.

With reference to FIG. 5, the heat power balance can be written as follows:

$$WC(t) + WD(t) + WSC(t) = \frac{tin(t) - tou(t)}{TR(tm(t))} + mc\frac{\partial\left(\frac{tin + tout}{2}\right)}{\partial t} \tag{4}$$

Where m is the mass of the layers between the two points where the first and second sensors 10 and 11 are located, c is the equivalent specific heat of such material (weighted as per volumes), tm(t) is the average between tin(t) and tout(t) and t is the time independent variable.

The last term on the right-hand side of equation (4) can have positive or negative sign if the cable is in a heating or cooling phase respectively. By time averaging both sides of the equation over a time interval long enough to nullify the last term of the equation (4), INT, and solving for WD, the following equation can be defined:

$$\overline{WD}(t) = \frac{\overline{tin(t)} - \overline{tou(t)}}{\overline{TR(tm(t))}} - \overline{WC(t)} - \overline{WSC(t)} \tag{5}$$

Where:

$\overline{WD}$(t) is the time average of the dielectric losses, between the times t and (t−INT);

$\overline{tin(t)}$ is the time average of the temperature measured by the first temperature sensor 10, respectively, between the times t and (t−INT);

$\overline{tou(t)}$ is the time average of the temperature measured by the second temperature sensor 11, respectively, between the times t and (t−INT);

$\overline{TR(tm(t))}$ is the time average of the thermal resistance TR(tm(t)), between the times t and (t−INT);

$\overline{WC(t)}$ is the time average of the heat generation within the conductor 4, between the times t and (t−INT);

$\overline{WSC(t)}$ is the time average of the heat generation within the screen 6, between the times t and (t−INT).

Considering the above considerations, an embodiment of a method for evaluating dielectric losses in the cable 1 is described below. Said method is implementable with the system 100 described above and is appliable to the cable 1 or to any other electrical objects, as already indicated. The calculations of the quantities described in the following method can be performed by the processor 2 according to a suitable software that can be easily designed considering the present description.

The method is applicable when the cable 1 is in operation and therefore a load current I(t) is made flowing through the conductor 4 of the cable 1.

In a computing step, the heat flux WC generated into the conductor 4 is computed based on the load current I(t) and, as an example, physical parameters of the conductor 4. For example, the heat flux WC can be computed as a function of the intensity of said load current I(t), a temperature tco assumed by the conductor 4 and value depending on a thermal behaviour of an electrical parameter of the electrical conductor (4). For example, said thermal behaviour is defined by the conductor electrical resistance per unit length $R_0$ at the reference temperature t0 and, for example, a temperature coefficient α of variation of the conductor electrical resistance with the temperature.

According to an embodiment, a time average $\overline{WC(t)}$ of the heat flux WC is computed basing on the quantities indicated above and according to the following equation:

$$\overline{WC(t)} = \overline{R_0[1 + \alpha(tc0 - t0)] * I(t)^2} \tag{6}$$

The temperature tc0 can be provided by a known Real Time Thermal Rating, RTTR, engine which may use the first temperature sensor 10 or the second temperature sensor 11 together with the load current as input. The load current I(t) can be measured by traditional techniques, such as directly measured by current transformers or amperemeters as well as obtained from interface communication (e.g.: Supervisory Control and Data Acquisition, SCADA). The conductor electrical resistance per unit length $R_0$ and the temperature coefficient α are predetermined considering the material of the conductor 4.

In a further computing step, the thermal resistance TR of the components of the cable 1 comprised between first and second points P1 and P2 is evaluated. For example, the thermal resistance TR can be evaluated as a sum of the thermal resistances TSC, TSH and TSE, already described with reference to the model of FIG. 3 and FIG. 4. The evaluation of the thermal resistance TR can be performed in designing and configuring the system 100. For example, the thermal resistance TR and its dependence on the temperature can be assessed by means of information available into the literature or provided by the materials manufacturers and recorded, as an example, in a database of the processor 2. In some implementations, the function TR(tm) is experimentally evaluated through tests under known current load and without the application of voltage stress.

In a measuring step, the first temperature sensor 10 provides the first temperature value tin, i.e. the temperature assumed inside the cable 1 at the first point P1. In another measuring step, the second temperature sensor 11 provides the second temperature value tout, i.e. the temperature assumed outside the cable 1 at the second point P2. For example, the first temperature value tin and the second temperature value tout are acquired by the processor 2 under the form of digital values. In some embodiments, for points P1 and P2 is measured and acquired the trend of the corresponding temperatures over a measuring interval.

In a computing step, a heat flux Fi crossing the components of the cable 1 included between the points P1 and P2 is evaluated according to the expression (3), above indicated. For example, averaging over the time an average flux $\overline{F}_i$ is computed as indicated below:

$$\overline{F}(t) = \frac{\overline{tin(t)} - \overline{tou(t)}}{\overline{TR(tm(t))}} \tag{7}$$

In another computing step, the dielectric losses WD of the cable 1 are computed as difference between heat flux Fi and the heat flux WC as expressed by equation (2). For example, a dielectric losses time average $\overline{\mathrm{WD}}$(t) over the interval INT is evaluated as the difference of the heat flux time averages $\overline{\mathrm{F}}$(t) and $\overline{\mathrm{WC(t)}}$:

$$\overline{WD}(t) = \frac{\overline{tin(t)} - \overline{tou(t)}}{\overline{TR(tm(t))}} - \overline{R_0[1 + \alpha(tc - t0)] * I(t)^2} \tag{8}$$

Each of the quantities WD and $\overline{\mathrm{WD}}$(t) represent the dielectric losses of the insulation layer 5 in a portion of the cable 1 including the measuring point P1 e P2. The above-described method can be applied to evaluate the dielectric losses in other portions of the cable 1 along its length considering other measuring points selected in a manner analogous to the one above described for points P1 and P2.

The dielectric losses WD and $\overline{\mathrm{WD}}$(t) evaluated according to equation (2) or equation (8) are valid when the heat flux WSC exiting the metallic screen 6 is considered negligible. If the heat flux WSC is not considered equal to zero and is evaluated considering its structure and the material employed, the dielectric losses WD and $\overline{\mathrm{WD}}$(t) can be computed in accordance with equation (5).

Advantageously, the above-described method includes a calibration procedure that allows optimizing the precision of the evaluation of the dielectric losses. According to an example, the tolerance of the temperature difference $\overline{\mathrm{tin(t)}}$–$\overline{\mathrm{tou(t)}}$ is optimized by a calibration including, at least, the condition that the tin=tout when the cable 1 is grounded and unloaded for a sufficient time.

Figure 6:
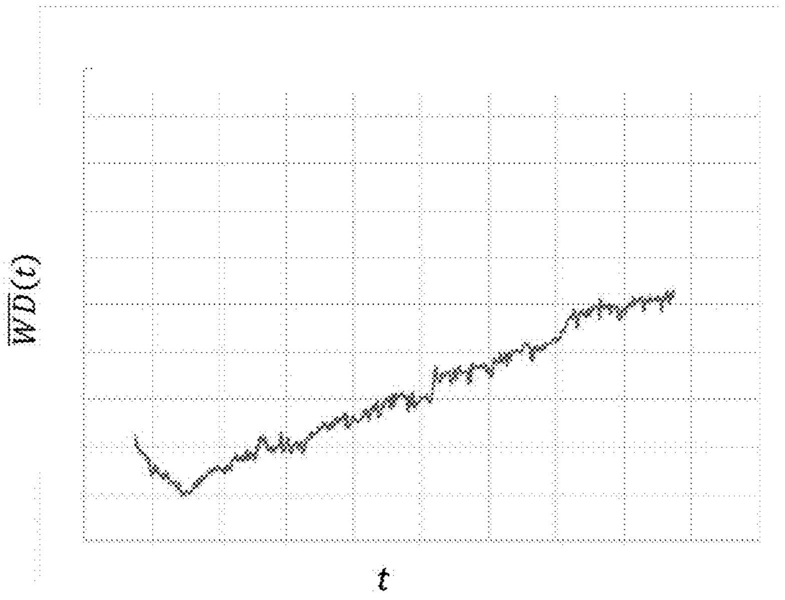
FIG. 6 shows by way of an example of an experimental trend of average dielectric losses vs time for an electrical cable, in normal conditions.

FIG. 6 shows, as an example, a trend of the average dielectric losses $\overline{\mathrm{WD}}$(t) vs. time in normal conditions: the dielectric losses increase in a more than linear but almost continuous way. In this case, the increase is related to an increasing average temperature into the dielectric layer.

Figure 7:
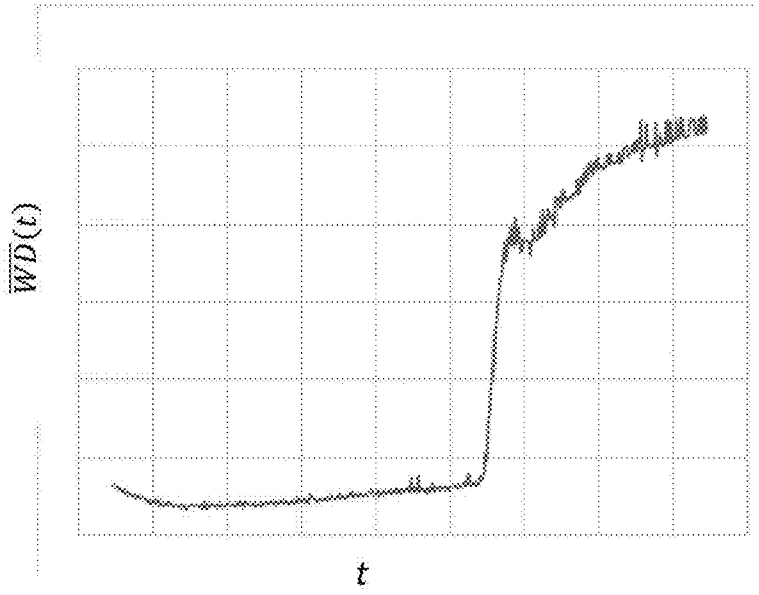
FIG. 7 shows by way of an example of an experimental trend of average dielectric losses vs time for an electrical cable, in alert conditions.

FIG. 7 shows, as an example, a trend of the average dielectric losses $\overline{\mathrm{WD}}$(t) vs. time in alert conditions: a big increase in the electrical conductivity of the dielectric starts a runaway phenomenon and a sudden increase in the dielectric losses can be observed.

Moreover, the described method for evaluating dielectric losses can include an alarm triggering procedure that can be implemented according to a first embodiment or a second embodiment.

With reference to the first embodiment, a predetermined threshold WDmax for the dielectric losses $\overline{\mathrm{WD}}$(t) is defined. In this case, an alarm is triggered if, at the time t, the dielectric losses $\overline{\mathrm{WD}}$(t) overcome said threshold:

$$\overline{WD}(t) > WD\mathrm{max} \tag{9}$$

Figure 8:
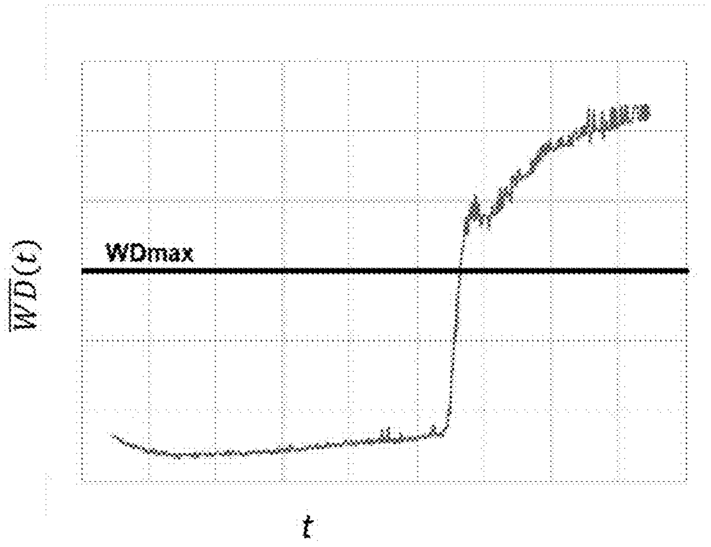
FIG. 8 shows by way of an example of an experimental trend of average dielectric losses vs time and a threshold employed to detect alert conditions.
Figure 9:
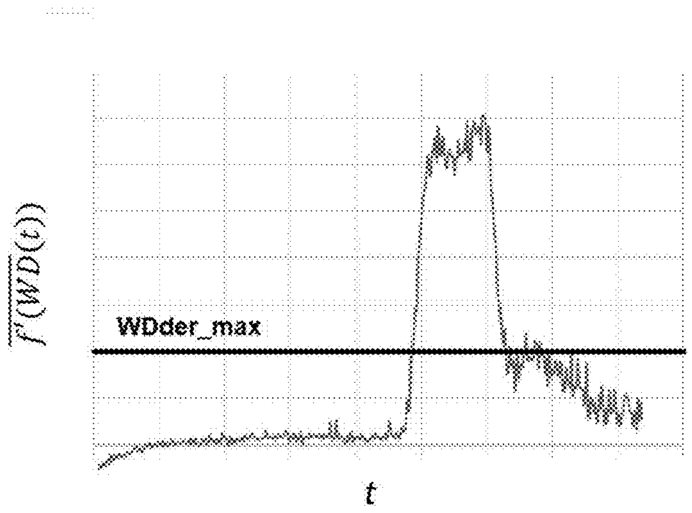
FIG. 9 shows by way of an example of an experimental trend of a derivative over time of the average dielectric losses and another threshold employed to detect alert conditions.

An example of the application of this embodiment is shown in FIG. 8, where the threshold WDmax is represented.

In accordance with the second embodiment, a function $f'(\overline{\mathrm{WD}}(t))$ obtained by processing $\overline{\mathrm{WD}}$(t) is compared with predetermined threshold WDder_max. The function $f'(\overline{\mathrm{WD}}(t))$ can be, in an example, a derivative over time of the average over an even longer period of the dielectric losses WD(t). The alarm is triggered if, at the time t, $$f'\left(\overline{WD}(t)\right) > \mathrm{WDder\_max} \tag{10}$$

Said second embodiment allows highlighting sudden variation of the dielectric losses.

It is observed that the above-described system and method allow evaluating dielectric losses along the length of HVDC electrical objects in real time and without requiring complex mathematical models. Moreover, the described system and method can be employed to detect abrupt variation in the dielectric losses and prevent severe faults (e.g., the thermal runway) related to damaging or ageing of the insulation layer. Finally, the described system can be used to detect imminent pre-fault conditions of parts of a HVDC electrical object and drive mitigating action to prevent the unavailability of an energy transmission system.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for evaluating dielectric loss, comprising:

providing a high voltage direct current (HVDC) electrical object comprising components including: an electrical conductor where a centre of the electrical object lies, an insulating layer surrounding said electrical conductor, a metallic screen surrounding said insulating layer, and an outer sheath surrounding the metallic screen;

applying an HVDC voltage between the conductor and the metallic screen and setting the HVDC object in an operating condition to enable an electrical current flowing through the electrical conductor;

computing a first heat flux exiting said electrical conductor based on an intensity of said electrical current;

measuring an internal temperature by a first temperature sensor arranged internally to the HVDC electrical object at a first radial distance from the centre;

measuring an external temperature by a second temperature sensor arranged at a second radial distance from the centre, the second radial distance greater than the first radial distance;

acquiring the internal and external temperatures and performing digital processing including:

determining a thermal resistance of a portion of said components positioned between the first and second temperature sensors, computing a second heat flux exiting said portion as based on the thermal resistance and a difference between said internal temperature and said external temperature;

computing a dielectric loss of the insulating layer based on a difference between the second heat flux and the first heat flux.

2. The method of claim 1, wherein the HVDC electrical object is one or more of: a HVDC cable, a HVDC cable joint, or a HVDC cable including a HVDC cable joint.

3. The method of claim 1, wherein the first temperature sensor is arranged one or more of: between an external wall of the insulating layer and the metallic screen; embedded into the metallic screen, or between an external wall of the insulating layer and an internal wall of the outer sheath.

4. The method according to claim 1, wherein the second temperature sensor is arranged on an external face of the outer sheath.

5. The method according to claim 1, wherein one or more of the first temperature sensor or the second temperature sensor comprises one or more of: a distributed optical sensing system, or a thermocouple sensor.

6. The method according to claim 1, wherein the determining the thermal resistance comprises retrieving a thermal resistance value from one of more recorded values.

7. The method according to claim 1, wherein the determining the thermal resistance comprises:

computing a first thermal resistance of said metallic screen;

computing a second thermal resistance of said outer sheath;

computing a third thermal resistance of a material positioned between the outer sheath and the second temperature sensor, obtaining said thermal resistance by adding the first thermal resistance, the second thermal resistance and the third thermal resistance.

8. The method according to claim 1, further comprising:

computing a third heat flux corresponding to a loss into the metallic screen;

computing the dielectric losses of the insulating layer by subtracting said third heat flux from said difference between the second heat flux and the first heat flux.

9. The method according to claim 1, wherein the computing the dielectric loss of the insulating layer is performed by considering a time average over a time interval of one or more of: the external temperature, the internal temperature, or the first heat flux.

10. The method according to claim 1, wherein the computing the first heat flux comprises evaluating an electrical resistance per unit length of said electrical conductor based on a temperature of the electrical conductor.

11. The method according to claim 1, wherein the computing the first heat flux further comprises:

evaluating a temperature of the electrical conductor by Real Time Thermal Rating.

12. The method according to claim 1, further comprising:

defining a threshold value;

comparing said threshold value with a comparison quantity determined based on said dielectric loss;

detecting an alarm condition when the comparison quantity is greater than said threshold value;

wherein said comparison quantity is one or more of: said dielectric losses or a derivative over time of said dielectric losses.

13. A dielectric losses evaluation system, comprising:

a high voltage direct current (HVDC) electrical object comprising following components: an electrical conductor for an electrical current, an insulating layer surrounding said electrical conductor, a metallic screen surrounding said insulating layer, an outer sheath surrounding the metallic screen, wherein a geometrical centre of the electrical conductor is about a centre of the electrical object;

a first temperature sensor arranged internally to the HVDC electrical object and at a first radial distance from the centre, and configured to measure an internal temperature;

a second temperature sensor arranged at a second radial distance from the centre, the second radial distance greater than the first radial distance, and configured to measure an external temperature; and a processor configured to acquire the internal and external temperatures and perform digital processing including:

computing a first heat flux exiting said electrical conductor based on an intensity of said electrical current;

determining a thermal resistance of a portion of said components positioned between the first temperature sensor and the second temperature sensor, computing a second heat flux exiting said portion as based on the thermal resistance and a difference between said internal temperature and said external temperature; and computing a dielectric loss of the insulating layer based on a difference between the second heat flux and the first heat flux.

14. The dielectric losses evaluation system of claim 13, wherein the first temperature sensor and the second temperature sensor are Distributed Optical Sensing System, and wherein the second temperature sensor is arranged externally to the outer sheath.

* * * * *